(12) United States Patent
Nunnally

(10) Patent No.: US 6,714,149 B2
(45) Date of Patent: Mar. 30, 2004

(54) ELECTRO-OPTICAL ANALOG TO DIGITAL CONVERSION METHOD AND DEVICE

(75) Inventor: William C. Nunnally, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 13 days.

(21) Appl. No.: 10/180,899

(22) Filed: Jun. 26, 2002

(65) Prior Publication Data

US 2004/0001016 A1 Jan. 1, 2004

(51) Int. Cl.$^7$ ................................................ H03M 1/12
(52) U.S. Cl. ........................................ 341/137; 341/155
(58) Field of Search ................................ 341/137, 155, 341/120, 159; 250/225

(56) References Cited

U.S. PATENT DOCUMENTS

| | | | |
|---|---|---|---|
| 5,010,346 | A | 4/1991 | Hamilton et al. |
| 5,039,988 | A | 8/1991 | Hong |
| 6,100,831 | A | 8/2000 | Frankel |
| 6,118,397 | A | 9/2000 | Heflinger |
| 6,188,342 | B1 | 2/2001 | Gallo |
| 6,219,172 | B1 | 4/2001 | Yariv |
| 6,246,350 | B1 | 6/2001 | Yap |
| 6,525,682 | B2 * | 2/2003 | Yap ............................ 341/137 |

FOREIGN PATENT DOCUMENTS

EP    1014588    6/2000

OTHER PUBLICATIONS

Marc Currie, Thomas R. Clark, and Paul J. Matthews, "Photonic Analog-to-Digital Conversion by Distributed Phase Modulation", IEEE Photonics Technology Letters, vol. 12, No. 12, Dec. 2000, pp. 1689–1691.

Warren Marwood, A. Peter Willis, Petar B. Atanackovic, Ken J. Grant and Ian G. Fuss, "A Wide-Band, High Precision Opto-electronic Analog-to-Digital Converter", Proceedings of International Conference on Signal Processing Applications and Technology, http://www.icspat.com/papers/230mfi.pdf, pp.486–490. (no date).

Thomas R. Clark Jr., "High-Performance Photonic Analog-to-Digital Converters", pp. WV1–1–WV1–3, Technical Digest, Mar. 21, 2001, Optical Fiber Communication Conference and Exhibit, Mar. 17–22, 2001, Anaheim Convention Center, Anaheim, California.

T. Saida, K. Okamoto, H. Yamada, K. Takiguchi, T. Shibata, A. Sugita, and K. Uchiyama, "Optical pulse pattern recognition circuit based on an optical digital-to-analog converter on a Planar Lightwave Circuit", pp. WY2–1–WY2–3, Technical Digest, Mar. 21, 2001, Optical Fiber Communication Conference and Exhibit, Mar. 17–22, 2001, Anaheim Convention Center, Anaheim, California.

* cited by examiner

*Primary Examiner*—Brian Young
(74) *Attorney, Agent, or Firm*—Greer, Burns & Crain, Ltd.

(57) ABSTRACT

In the invention, an analog signal is converted to an optical deflection. In preferred embodiments, an N-bit parallel output is obtained. A particularly preferred embodiment patterns the light beam with a spatial filter into an N-bit binary light pattern that is then collected and sensed by optical detectors.

22 Claims, 6 Drawing Sheets

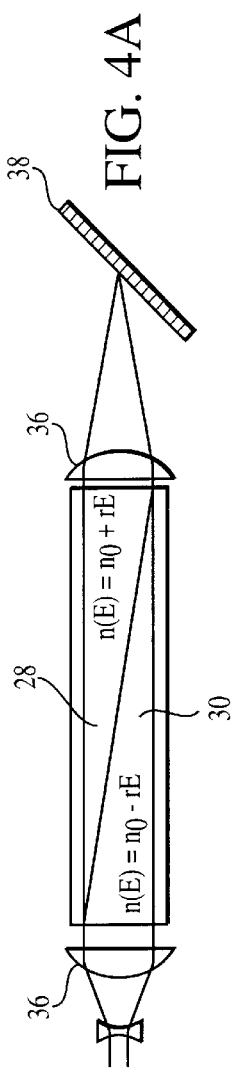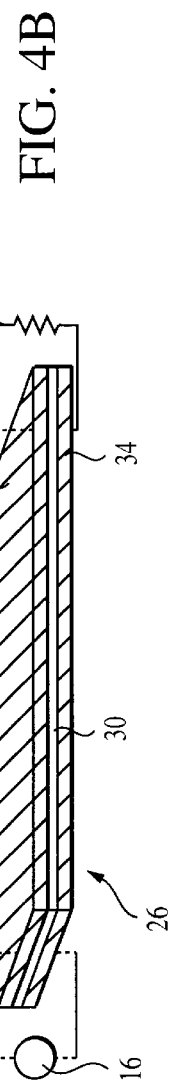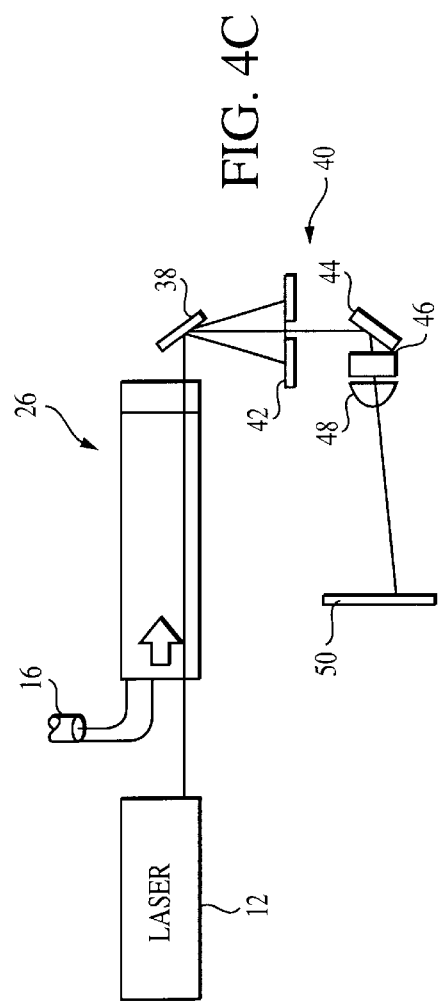

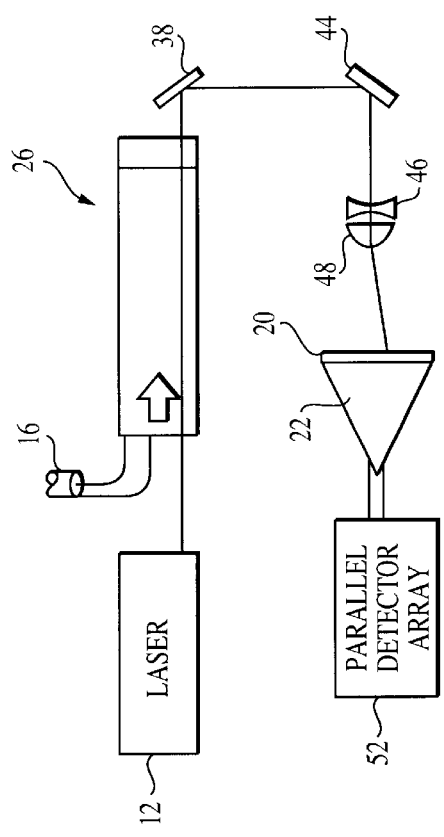
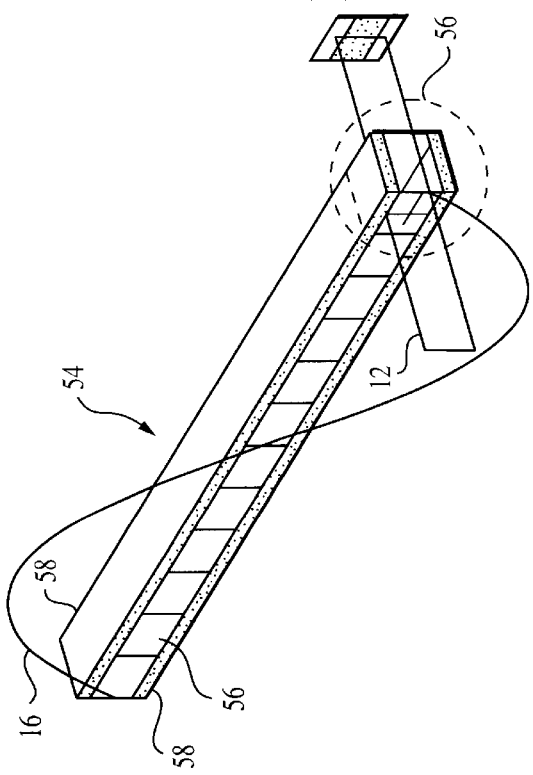

ELECTRO-OPTICAL ANALOG TO DIGITAL CONVERSION METHOD AND DEVICE

TECHNICAL FIELD

A field of the invention is signal conversion. The invention is directed to the digitization of analog signals.

BACKGROUND ART

Conversion of analog signals into digital signals is a fundamental task necessary in uncountable varieties of electronic devices. Conventional analog to digital converters (ADCs) employ electronic circuitry and repetitive processing to define the digital value of an analog signal. Higher frequency signals require higher sampling rates, i.e., the rate at which an analog signal is measured for the purpose of determining a corresponding digital value. One guideline is known as the Nyquist criteria. The Nyquist criteria requires that the digital sampling rate be greater than two times the analog frequency in order to faithfully reproduce the analog signal from the digital values. In practice, the sampling rate is typically chosen to be 5 times the analog frequency to be sampled. As frequencies of interest become high, e.g., in the tens of GigaHertz, conventional electronic techniques may not meet a desired rate of sampling. Even at lower frequencies, the electronics for a high quality analog to digital conversion may become complex and expensive.

DISCLOSURE OF THE INVENTION

In the invention, an analog signal is converted to an optical deflection. Conversion may be conducted at the rate of change permitted by the lower of the speed of deflection or rate of optical pulses delivered to the deflector. In preferred embodiments, an N-bit parallel output is obtained. A particularly preferred embodiment patterns the light beam with a spatial filter into an N-bit binary light pattern that is then collected and sensed by optical detectors.

BRIEF DESCRIPTION OF THE DRAWINGS

FIGS. 4A and 4B illustrate a preferred optical voltage to wavelength converter;

FIG. 4C illustrates an electro-optical analog to digital converter using the FIGS. 4A and 4B wavelength converter;

FIG. 4D illustrates an alternate electro-optical analog to digital converter using the FIGS. 4A and FIGS. 4B wavelength converter;

FIG. 5 illustrates a preferred electro-optical deflection cell geometry;

BEST MODE OF CARRYING OUT THE INVENTION

The deflection of an optical beam is used to encode a digital signal. An analog signal to be encoded is applied to an optical deflector. A light beam is passed through an optical deflector. Encoding is realized with a digital value that depends upon the angular deflection of the light beam. A pulsed light beam may be used in preferred embodiments. The speed of conversion is limited in theory only by the speed of optical detectors used to detect the optical beam. In practice, optical pulse frequency, width of optical pulses, and the speed deflection will limit rate of conversion until the several to ten picosecond pulse rate of optical detectors is equaled or exceeded.

An analog signal voltage to optical wave deflection may use the electro-optical effect to affect a change in the index of refraction of a bi-refringent crystal. Another preferred method for the deflection is to configure a voltage to wavelength converter and use diffractive elements such as a grating to select a wavelength and a subsequent grating to deflect the wavelength across a spatial filter. While these manners of deflection are preferred, the invention is not limited in its broader aspects to any particular method for the deflection that is proportional to the magnitude of an analog signal to be converted.

Figure 1:
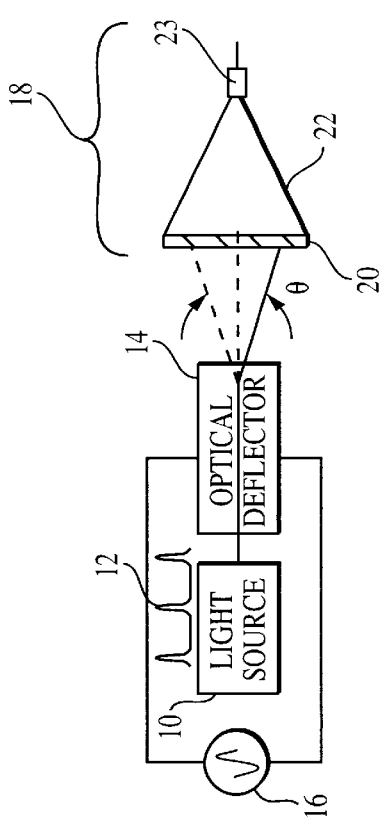
FIG. 1 is a block diagram of a preferred embodiment electro-optical analog to digital converter.

Referring now to FIG. 1, a schematic view of a preferred embodiment optical probe analog to digital converter is shown. The preferred converter includes a light source 10 that emits a light beam 12. An optical deflector 14 accepts and deflects the output of the light beam 12 in angular variations that depend upon a magnitude of an analog signal 16 to be converted. The range of deflection encompasses $2^N$ angular variations corresponding to an analog to N-bit digital conversion. The deflection itself in the preferred embodiment is analog, but encompasses the discrete angular variations. A discrete incremental deflection by the optical deflector 14, i.e., digital deflection in $2^N$ discrete angles of deflection would also work. As used herein, the phrase range of deflection encompasses a continuous and discrete deflection by the optical deflector 14. An optical detection system 18 translates the deflection encompassing $2^N$ angular variations into a N bit parallel output encoding $2^N$ digital bits.

The light source 10 is preferably a pulsed laser. The repetition frequency of the pulse laser light source 10 can set the conversion rate of the converter. In the preferred embodiment, the optical detection system 18 includes a spatial filter 20 that patterns the light beam 12. The purpose of the spatial filter 20 is to pattern the light into a binary bit pattern.

Figure 2:
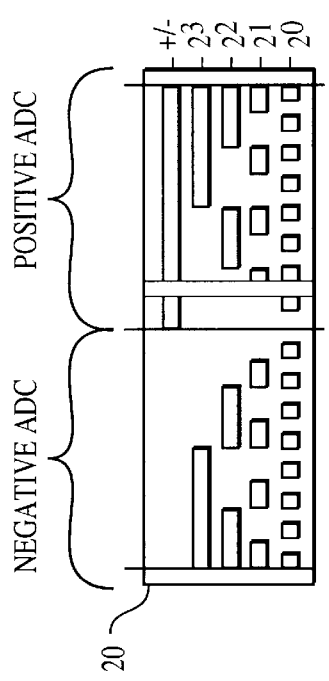
FIG. 2 illustrates a preferred spatial filter.

The spatial filter, an example of which is shown in FIG. 2, includes $2^N$ binary bit patterns arranged in columns including a zero deflection pattern and 2 N- positive value deflection patterns that mimic N-bit digital "1"and "0" patterns preferably arranged from the least significant bit to the most significant bit. A straightforward implementation passes light from the light beam 12 corresponding to "1" bits and blocks light corresponding to "0" bits. Each column includes N rows to realize a parallel encoding of N bits. In the preferred embodiment, an N+1 row serves as positive/negative indication bit, and an additional set of $2^{N-1}$ negative value deflection patterns in the spatial filter 20 encode negative bits. An optical collection system 22 collects light passing the spatial filter 20 and directs it to a N+1 bit array of photo-conductors 23 that convert the collected optical energy pulses to N-bit digital electrical pulses (and includes the N+1 extra detector for a positive/negative indication bit).

In the preferred embodiment, there is a linear relationship between the angle of deflection and the bit being encoded. The angular deflection of the probe optical pulse light beam 12 for zero voltage is also zero and corresponds to the center of the spatial filter. A positive voltage results in a deflection in one direction that increases in a linear fashion in proportion to the analog signal 16. A negative voltage results in a deflection in the other direction that increases in a linear fashion in proportion to the analog signal 16. The total range of light beam deflection is indicated in FIG. 1 by the angle θ. Other relationships between the angle of deflection and the bit being encoded that produce an N-bit parallel output having a unique value for the range of $2^N$ angular variations are also permissible.

Figure 3:
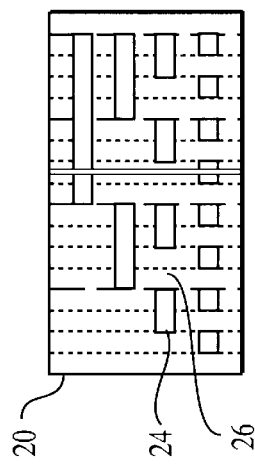
FIG. 3 illustrates the binary bit pattern spatial function implemented by the spatial filter of FIG. 2.

The FIG. 2 preferred implementation of the spatial filter 20 is graphically represented for explanatory purposes in FIG. 3. Negative bits and the additional bit for positive/negative encoding are not shown in FIG. 3. The negative bits of FIG. 2 are the mirror image of the positive bit encoding for the binary bit pattern spatial function shown in FIG. 3. The spatial filter includes apertures 24 arranged in N rows and $2^N$ columns that encode "1" bits by passing the light beam, which spans the N+1 rows. Masks 26 encode "0" bits. Specifically, each of the columns encodes an N bit digital value with the rows coding bits from a least significant bit to a most significant bit. FIGS. 2 and 3 represent a 4 bit conversion, but the binary patterns encoded are easily extended to many more bits. The only limits on the number of bits that may be encoded are the range and speed for the optical deflection. The resolution of the spatial filter has no affect on the speed of the converter, permitting increases in the resolution conversion independent of the speed of conversion.

While the FIG. 1 embodiment directs light passing the spatial filter 20 to the optical collection system 22 with an N+1 array of detectors 23, the filter also would permit optical energy to pass through the apertures 24 directly onto an array of optical detectors or optical fibers. Another alternative omits the spatial filter completely. In this alternative, an array of detectors has the graphical pattern shown in FIGS. 2 and 3. The apertures are replaced with active detectors, and the masks have no detectors, inactive detectors, or detectors controlled to be inactive.

In FIG. 3, a top row of apertures 24 represents the most significant bit and arranges 8 of the aperture areas together and 8 of the mask areas together. If the analog signal creates a deflection that is greater than 8 columns of the FIG. 3 pattern, the $2^3$ bit output is equal to 1. Similarly, the second row represents the $2^2$ bit, and for the example shown in FIG. 3, zero optical energy will be transmitted through the filter resulting in a zero optical output for this bit. The third row represents the $2^1$ bit which also equals zero in FIG. 3 example. The bottom row represents the $2^0$ bit and optical energy will be transmitted such that the least significant bit will equal "1" for the example of FIG. 3. Thus, the digital word that represents the analog voltage illustrated in FIG. 3 is 1001.

A voltage to optical wave deflection system can be embodied in a number of ways. A preferred deflector and deflector system uses the electro-optical effect to affect a change in the index of refraction of a birefringent crystal. This is shown in FIGS. 4A and 4B. In FIGS. 4A and 4B, the analog signal 16 is applied to an electro optical interaction cell 26. The interaction cell 26 is a transmission line dielectric fabricated of two bi-refringent crystals 28, 30 between transmission line conductors 32, 34. The sampling beam 12 is expanded to the width of the transmission line conductors 32, 34 by beam expansion optics 36. The two bi-refringent crystals 28, 30 have opposite crystal orientations such that the index of refraction on one side of the transmission line is increased by a traveling wave electric field induced by a load 38 while the index of refraction on the other side of the transmission line is reduced. The index of refraction varies as a function of the electric field E, and the $r_{63}$ coefficient of the electro-optical tensor or $$n(E) = n_0 \pm r_{63} \cdot E$$

where the sign of the second term is determined by the crystal orientation. For example, the electro-optical coefficient for Lithium Niobate (LiNbO$_3$) is $r_{63}=32\times10^{-12}$ m/V and for Strontium Barium Nitrate (Br$_x$Sr$_{1-x}$Nb$_2$O$_6$) is as large as $r_{63}=1400\times10^{-12}$ m/V. SBN is the electro-optical media of choice since it provides more sensitivity. If the input digitizer input voltage is limited to 5V maximum, the thickness of the crystal and thus the height of the transmission line, $d_{TL}$, should be reduced to the minimum optically possible to obtain the desired deflection angle in the length, $L_{TL}$, of the transmission line interaction region. If the deflection angle is small, the deflection angle is approximated by $$\phi \approx \frac{n_o^3 \cdot r_{63} \cdot V \cdot L_{TL}}{w_{TL} \cdot d_{TL}}$$

where V is applied voltage $W_{TL}$ is the width of the transmission line, and $n_o$ is the nominal index of the refraction of the crystal.

Another constraint on the transmission line is the impedance that is approximated by $$Z_{TL} = \sqrt{\frac{\mu_o}{\varepsilon_o}} \cdot \sqrt{\frac{1}{\varepsilon_o} \cdot \frac{d_{TL}}{w_{TL}}} = \sqrt{\frac{\mu_o}{\varepsilon_o}} \cdot \frac{1}{n_o} \cdot \frac{d_{TL}}{w_{TL}}$$

where $e_c$ is the relative permeability of the crystal and equal to the square root of the index of refraction, $n_o$.

FIG. 4C shows an exemplary alternate optical ADC making use of the FIGS. 4A and 4B optical deflection. When an electric field is applied to the transmission line conductors 32, 34 the phase of the plane wave entering the transmission line is altered as it traverses the transmission line so that the phase of the output wavefront is focused through beam collection optics 36 onto a grating 38 at a different angle on the grating 38. The grating 38 output illuminates a slit that selects a specific wavelength band that is further projected on a spatial filter 40 having a beam slit 42, a second grating 44, a cylindrical expansion 46 and focusing optics 48.

Once the optical pulse has traversed the analog electric field along the transmission line, the optical deflection is related to the analog voltage. The optical deflection is then related to a specific wavelength band using two gratings 38 and 44. The change in direction of the beam 12 through the interaction cell 26 is translated into a specific incident angle at the grating 38. The narrow slit 42 is used to select a narrow wavelength band is then imaged on the grating 44 and expanded in one direction to form a line. It is then expanded by expansion optics 46, focused by focusing optics 48, and focused on a spatial detector 50, e.g., a CCD array.

In a high sampling rate system, the CCD array of FIG. 4C must be replaced with a higher frequency optical detection system, an integrated optical waveguide collection system and traveling wave optical detectors to enable the electronics to keep up with the sampling rate. FIG. 4D shows such a high sampling rate system that uses the voltage to wavelength conversion and deflection of FIGS. 4A–4C with the optical collection and sensing of FIGS. 1–3. The CCD array is replaced with a high speed parallel detector array 52. The use of a spatial filter 20 with binary bit pattern of FIGS. 2–3 avoids the need for the slit 42 of FIG. 4C.

An alternate preferred optical deflector is illustrated in FIG. 5. In FIG. 5, a transmission line 54 carries the analog signal 16 to be sampled. A number of electro-optical deflection cells 56 make up the dielectric of the transmission line 54, formed between transmission line conductor 58. Optical pulses 12 transmitted through each optical cell 56 are deflected in proportion to the voltage across the transmission line 54 at the point of beam crossing. The electro-optical deflection cell length along the transmission line 54 is selected such that the length of transmission line being sampled is equal to a small fraction of the highest wavelength to be sampled. A single wavelength of the highest frequency to be sampled is also illustrated in FIG. 4A. Note that an optical pulse can be applied to each of the cells 56 simultaneously or a high rate of optical pulses can be applied to a single cell 56 to sample the voltage wave as it traverses the transmission line. Each electro-optical deflection cell 56 is fabricated of two bi-refringent crystals with opposite crystal orientations such that the index of refraction on one side of interface is increased by the traveling wave electric field while the index of refraction on the other side of the interface is reduced, as in FIG. 4A. The resultant electro-optical deflection cell geometry is diagramed in FIG. 6 where the increased index is identified as $n^+$ and the reduced index is identified as $n^{31}$. With zero voltage applied to the cell, the deflection angle of the optical probe pulse is displayed on the center of the spatial filter shown in FIG. 2. The FIG. 2 filter includes apertures 24 (see FIG. 3) to encode 4 bits, both negative and positive, and an additional aperture 24 as an indication of a positive value. In FIG. 2, the right side of the filter determines the digital signal for a positive input voltage and the left side of the filter determines the digital signal for a negative input voltage. Optical energy from the probe pulse passes through the spatial filter where it is collected and transferred to detector array. Positive signals deflect the optical pulse probe to the right and negative signals to the left.

The transmission angle of the optical ray passing through a boundary is given by Snell's second law or $$\sin\Theta_T = \frac{n_I}{n_T} \cdot \sin\Theta_I$$

where $\theta_1$ is the incident angle and $\theta_T$ is the transmitted angle, $n_I$ is the index of the incident ray and $n_T$ is the index of the transmitted ray. Without a voltage applied to the cell, the transmitted angle is equal to the incident angle since the index for both sides is $n_o$. When voltage, V, is applied, the deflection angle is determined by the difference in indices or $$\sin\Theta_T = \sin\Theta_I \cdot \frac{n_o \cdot d + r_{63} \cdot V}{n_o \cdot d - r_{63} \cdot V} = \sin\Theta_I \cdot \left[\frac{1 + \frac{r_{63} \cdot V}{n_o \cdot d}}{1 - \frac{r_{63} \cdot V}{n_o \cdot d}}\right] \cong \sin\Theta_I \cdot \left(1 + \frac{2 \cdot r_{63} \cdot V}{n_o \cdot d}\right)$$

Figure 7:
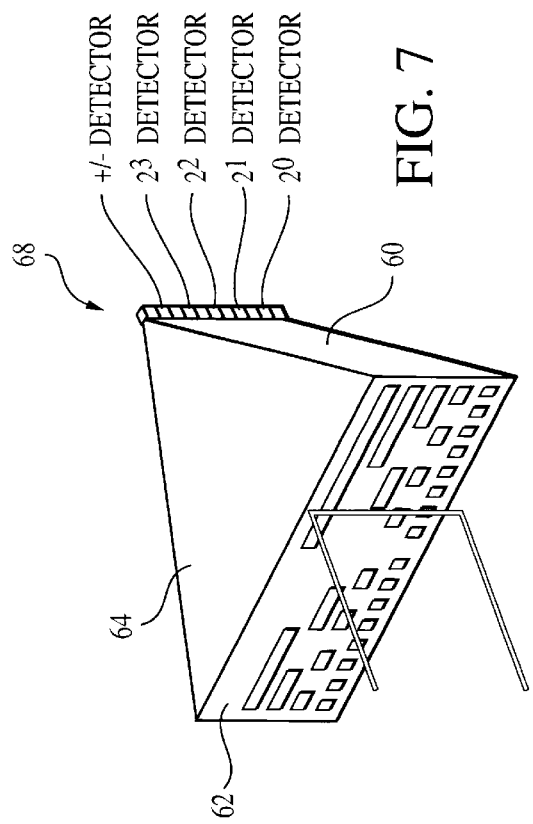
FIG. 7 illustrates a preferred embodiment optical collection system.
Figure 6:
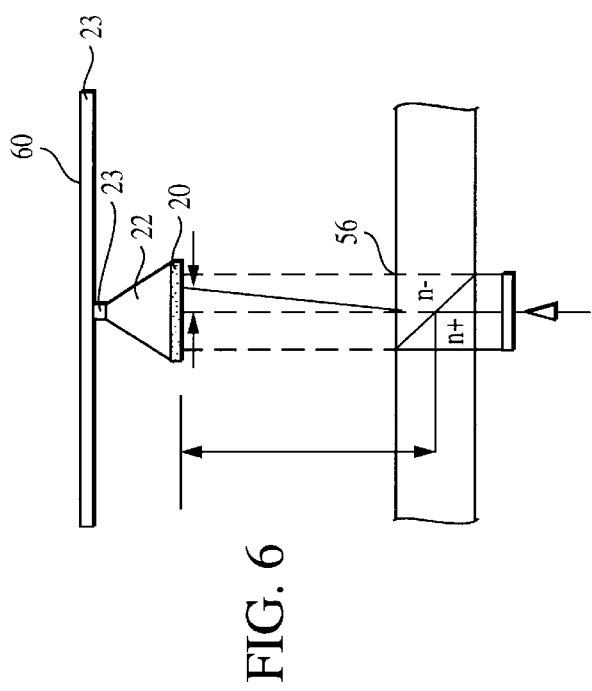
FIG. 6 illustrates a preferred electro-optical analog to digital converter using the FIG. 5 cell.

In FIG. 6, collection optics 22 pass the binary bit patterned beam to the optical detectors. Preferably, the optical detectors produce a parallel output that is transmitted to a data bus 60. A preferred optical collection system is illustrated in FIG. 7. As with other example, 4-bit encoding is used for convenience in illustrating the invention. Optical energy passing through a spatial filter 62 is collected using an optical collection system 64 formed from optical waveguides 60. The spatial filter 62 follows the binary bit pattern of FIGS. 2–3. The light passing the apertures retains its pattern and is directed toward an array 68 of N+1 photo-detectors. There are N detectors for encoding N-bit parallel data plus an additional detector for a positive/negative indication bit.

Figure 8:
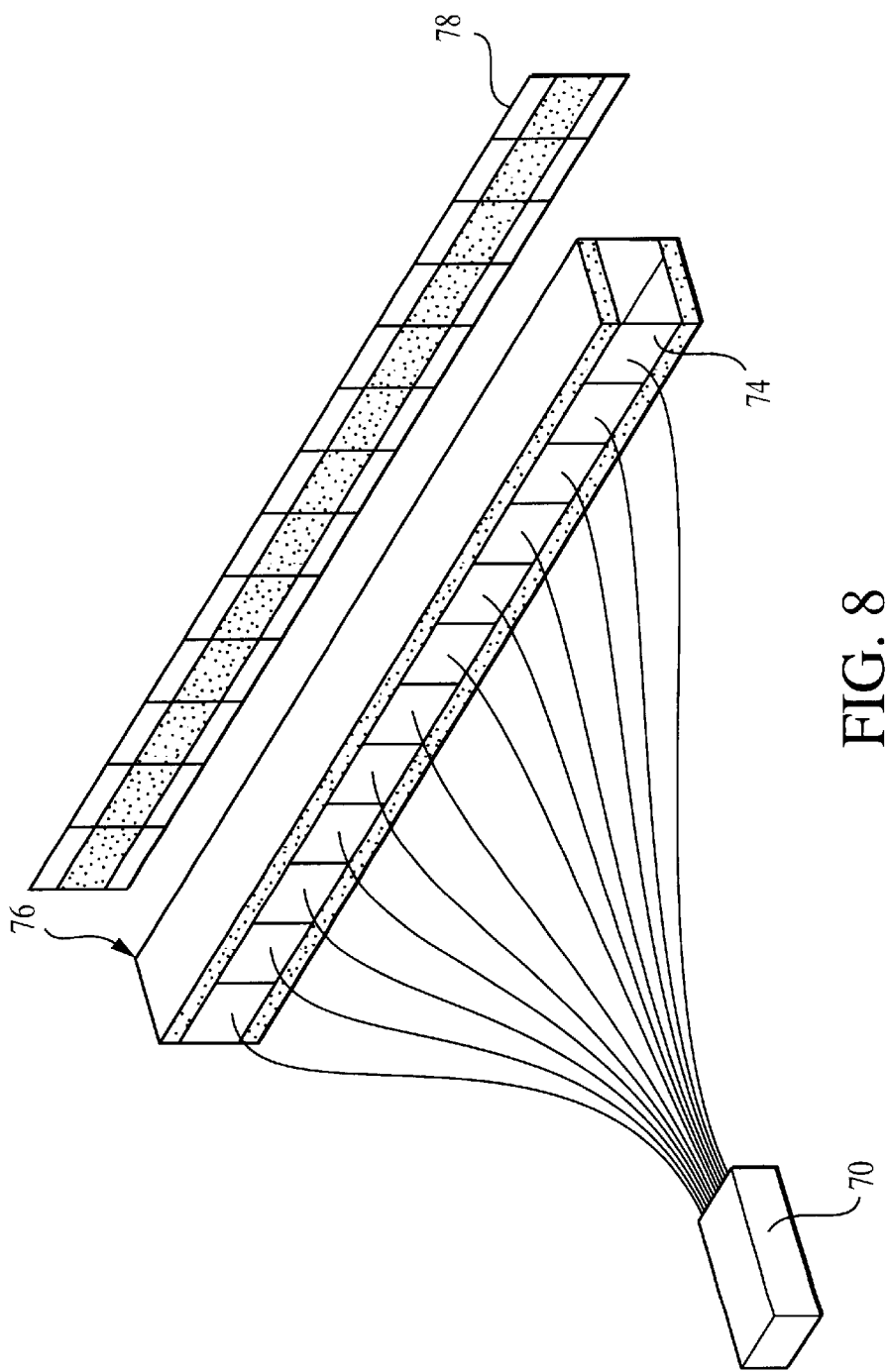
FIG. 8 illustrates a preferred parallel probing of a plurality of optical deflection cells.

There are several configurations for sampling the analog signal along the transmission line. Many electro-optical cells illustrated in FIG. 5 can be probed with optical signals in parallel as illustrated in FIG. 8. In FIG. 8, a laser probe source 70 emits parallel probe beams through optical fibers. Each fiber probes a separate electro-optical cell 74 formed in the transmission line deflector 76 according to FIG. 5. A spatial filter 78 imposing a binary bit pattern based upon deflection angle is associated with each electro-optical cell 74. Collection optics are not shown, but follow FIGS. 5–7. In this fashion, the optical pulse rate from the sampling optical source can be reduced due to the parallel nature of the sampling configuration. Another option is to use only one cell and a very high pulse rate laser to sample the wave as it moves along the transmission line.

The parallel sampling configuration of FIG. 8 requires a plurality of spatial filter components and electro-optical cells. However, these components can be fabricated using integrated optical techniques to reduce the cost as well as the physical size. The parallel configuration also reduces the pulse width requirements on the optical probe source. The sampling interval is the time required for the optical probe pulse to traverse the electro-optical deflection cell. The pulse rate required or the optical probe source is reduced to the sampling rate divided by the number of parallel optical paths. For example a 100 GHz sampling rate can be probed with an optical pulse rate of 10 GHz if ten electro-optical cells are used in the parallel configuration.

Figure 9:
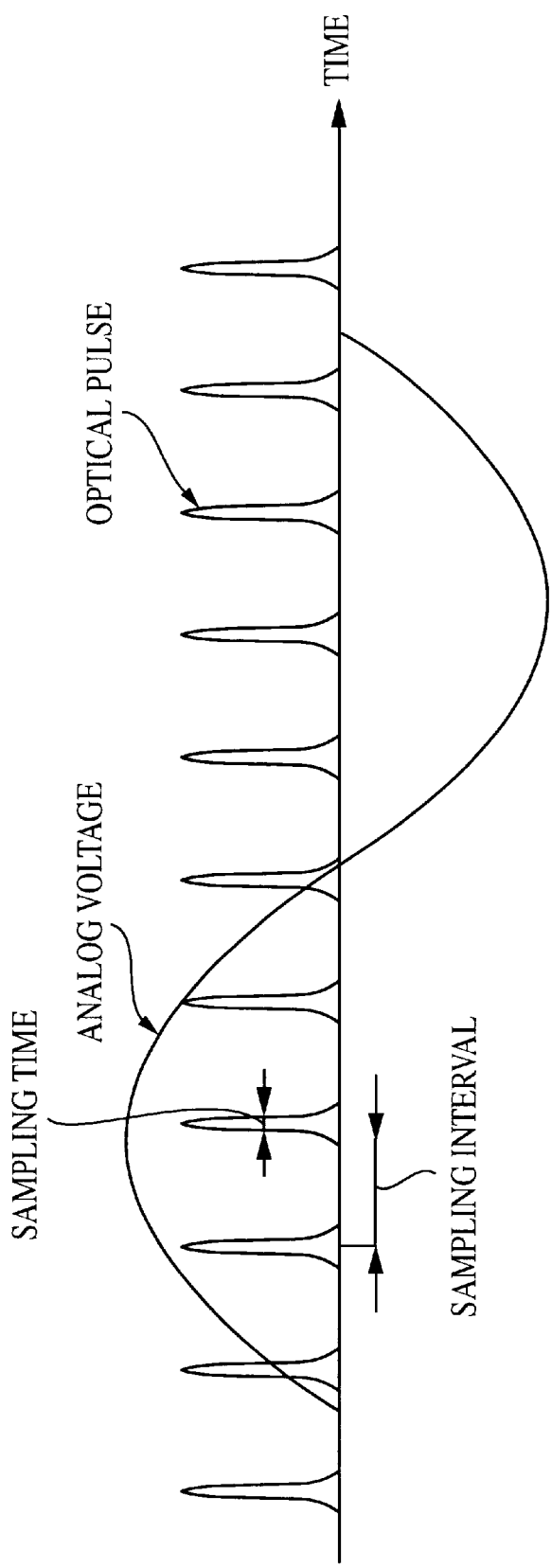
FIG. 9 illustrates a waveform for signal source sampling by a high pulse rate optical source with a optical pulse width less than the inter pulse spacing.

In order to implement a single site sampling system, a high pulse rate optical source with a optical pulse width less than the inter pulse spacing is required as illustrated in FIG. 9. The optical probe pulse duration is equal to the desired sampling time and the optical pulse repetition rate is equal to the sampling rate, as illustrated in FIG. 9. For example, the a pulse width of 1 pico-second or 1 ps and a pulse spacing of 10 ps will result in a ADC sampling rate of 100 GHz and an analog bandwidth of 20 GHz. An alternative high sampling rate system replaces the CCD array with a spatial optical filter, an integrated optical waveguide collection system and an array of high speed photodetectors, e.g., traveling wave optical detectors, to enable the detectors to respond to very short optical pulse duration.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. An optical probe analog to digital converter comprising:
   a light source emitting a light beam;
   an optical deflector that accepts and deflects the output of said light beam in angular variations that depend upon a magnitude of an analog signal to be converted, said deflector having at least $2^N$ angular variations corresponding to an analog to N-bit digital conversion; and an optical detection system for translating said $2^N$ angular variations into a N bit parallel output encoding $2^N$ digital bits.

2. The analog to digital converter of claim 1, wherein said optical detection system comprises a detector array that produces an N-bit parallel output having a unique value for each of said $2^N$ angular variations.

3. The analog to digital converter of claim 2, wherein said detector array includes N patterned sets of detectors, each set patterned for coding one of said N bits with the sets together establishing a $2^N$ parallel output having a unique bit value for each of said $2^N$ variations.

4. The analog to digital converter of claim 1, wherein:

said $2^N$ variations include an angular variation corresponding to no deflection.

5. The analog to digital converter of claim 4, wherein:

said $2^N$ angular variations code a zero value and $2^{N-1}$ positive values and said optical detection system translates an additional $2^{N-1}$ angular variations to code $2^{N-1}$ negative values.

6. The analog to digital converter of claim 5, wherein said optical detection system further encodes a negative/positive indication bit depending upon the angular deflection of the light beam.

7. The analog to digital converter of claim 6, wherein said optical detection system includes a detector array having N patterned sets of detectors, each set patterned for coding one of said N bits with the sets together establishing a $2^N$ parallel output having a unique bit value for each of said $2^N$ angular variations, and said detector array further includes an N+1 detector set to code one of an angular variation indicating one of said $2^{N-1}$ positive values and an angular variation indicating one of said $2^{N-1}$ positive values.

8. The analog to digital converter of claim 1, wherein said optical detection system comprises:

a spatial filter having a unique N element filter pattern for each of said $2^N$ angular variations; and N optical detectors for detecting the filter pattern and outputting a N-bit digital value corresponding to the filter pattern.

9. The analog to digital converter of claim 8, wherein the optical detection system further comprises an optical collection system disposed between said spatial filter and said detector array to collect light passing said spatial filter and direct the same to said detector array.

10. The analog to digital converter of claim 8, wherein:

said spatial filter comprises apertures arranged in N rows and $2^N$ columns, each of said columns encoding an N bit digital value with the rows coding bits from a least significant bit to a most significant bit; and said detector array comprises a single column of N detectors arranged from least significant bit to most significant bit.

11. The analog to digital converter of claim 8, wherein:

said spatial filter comprises apertures arranged in N rows and $2^N$ columns, each of said columns encoding an N bit digital value with the rows coding bits from a least significant bit to a most significant bit; and said detector array comprises active detectors corresponding to the apertures and arranged in N rows and $2^N$ columns, said rows being arranged from a least significant bit to a most significant bit.

12. The analog to digital converter of claim 1, wherein said light source comprises a pulsed laser and said optical detection system converts pulses deflected by said optical deflector to N-bit digital electrical pulses.

13. An optical probe analog to digital converter comprising:

a light source producing a light beam;

an optical deflector for deflecting the light beam in an angle proportional to the magnitude of an analog signal to be converted; and optical detection means for producing a parallel N bit digital output, wherein the digital output depends upon the deflection angle of the light beam.

14. An optical probe analog to digital converter comprising:

an optical detection system including N rows corresponding to N bits to be encoded and $2^N$ columns corresponding to $2^N$ digital values to be encoded;

a light source producing a light beam having a shape that spans N rows of said optical detector system but only one column or less of said optical detection system; and an optical deflector for deflecting said light beam over the range of the $2^N$ columns in response to an analog signal to be converted.

15. The analog to digital converter of claim 14, wherein said rows are arranged to code bits from a least significant to most significant bit.

16. The analog to digital converter of claim 15, wherein said optical detection system comprises an N row and $2^N$ column spatial filter that patterns the light beam into a patterns such that, when the beam is deflected to one of said $2^N$ columns, light passes onto rows that would have "1" bits for the particular value being encoded, wherein the pattern blocks all rows for a value of zero and passes all rows for a digital value of $2^{N-1}$.

17. The analog to digital converter according to claim 15, wherein said optical detection system further comprises:

N light detectors arranged in a N row column; and an optical collection system disposed between said spatial filter and said N light detectors to collect light passing said spatial filter and direct the same to said N light detectors.

18. The analog to digital converter according to claim 17, further comprising $2^{N-1}$ additional columns in said spatial filter to encode negative digital values.

19. The analog to digital converter according to claim 18, wherein said spatial filter comprises an additional row to indicate positive or negative values, wherein said beam further spans said additional row, and further comprising an N+1 light detector to detect said additional row.

20. A method for performing an analog to digital conversion of an analog signal, the method comprising steps of:

applying the analog signal to an optical deflector;

passing a light beam through the optical deflector; and outputting a digital value that depends upon the angular deflection of the light beam.

21. The method according to claim 20, further comprising a step of patterning the light beam into $2^N$ N-bit digital bit patterns, wherein the patterns change depending upon the amount of angular deflection of the light beam.

22. The method according to claim 20, further comprising a step of detecting the patterns.

* * * * *

UNITED STATES PATENT AND TRADEMARK OFFICE
CERTIFICATE OF CORRECTION

PATENT NO. : 6,714,149 B2
DATED : March 30, 2004
INVENTOR(S) : Nunnally

It is certified that error appears in the above-identified patent and that said Letters Patent is hereby corrected as shown below:

Column 2,
Line 49, delete "2N-" and insert -- $2^{N-1}$ -- therefor

Column 4,
Lines 4, 6, 10 and 12, delete "$r_{63}$" and insert -- $r_{33}$ -- therefor Lines 21-25, delete " $\phi \approx \dfrac{n_o^3 \cdot r_{63} \cdot V \cdot L_{TL}}{w_{TL} \cdot d_{TL}}$ " and insert -- $\phi_d \approx \dfrac{n_o^3 \cdot r_{33} \cdot V \cdot L_{TL}}{w_{TL} \cdot d_{TL}}$ -- therefor Lines 31-35, delete " $Z_{TL} = \sqrt{\dfrac{\mu_o}{\varepsilon_o}} \cdot \sqrt{\dfrac{1}{\varepsilon_o}} \cdot \dfrac{d_{TL}}{w_{TL}} = \sqrt{\dfrac{\mu_o}{\varepsilon_o}} \cdot \dfrac{1}{n_o} \cdot \dfrac{d_{TL}}{w_{TL}}$ " and insert -- $Z_{TL} = \sqrt{\dfrac{\mu_o}{\varepsilon_o}} \cdot \sqrt{\dfrac{1}{\varepsilon_e}} \cdot \dfrac{d_{TL}}{w_{TL}} = \sqrt{\dfrac{\mu_o}{\varepsilon_o}} \cdot \dfrac{1}{n_o} \cdot \dfrac{d_{TL}}{w_{TL}}$ -- therefor Column 5,
Line 29, delete "$n^{31}$" and insert -- $n^-$ -- therefor Signed and Sealed this Second Day of August, 2005

JON W. DUDAS
*Director of the United States Patent and Trademark Office*